(12) United States Patent
Lewington et al.

(10) Patent No.: US 7,846,848 B2
(45) Date of Patent: Dec. 7, 2010

(54) CLUSTER TOOL WITH INTEGRATED METROLOGY CHAMBER FOR TRANSPARENT SUBSTRATES

(75) Inventors: Richard Lewington, Hayward, CA (US); Corey Collard, San Jose, CA (US); Scott Anderson, Livermore, CA (US); Khiem Nguyen, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 469 days.

(21) Appl. No.: 11/532,195

(22) Filed: Sep. 15, 2006

(65) Prior Publication Data
US 2007/0012660 A1    Jan. 18, 2007

Related U.S. Application Data

(63) Continuation of application No. 11/031,400, filed on Jan. 8, 2005, now abandoned.

(51) Int. Cl.
*H01L 21/302* (2006.01)

(52) U.S. Cl. .......................... 438/723; 438/7; 438/706; 438/716

(58) Field of Classification Search .............. 438/7, 438/10, 706, 716, 723; 216/59, 67, 80
See application file for complete search history.

(56) References Cited

U.S. PATENT DOCUMENTS

| | | |
|---|---|---|
| 4,447,731 A | 5/1984 | Kuni et al. |
| 4,767,496 A | 8/1988 | Hieber |
| 4,911,103 A | 3/1990 | Davis et al. |
| 5,109,430 A | 4/1992 | Nishihara et al. |
| 5,171,393 A | 12/1992 | Moffat |
| 5,452,521 A | 9/1995 | Niewmierzycki |
| 5,653,894 A | 8/1997 | Ibbotson et al. |
| 5,798,529 A | 8/1998 | Wagner |
| 5,913,102 A | 6/1999 | Yang |
| 5,926,690 A | 7/1999 | Toprac et al. |
| 5,944,940 A | 8/1999 | Toshima |
| 5,948,203 A | 9/1999 | Wang |
| 5,963,329 A | 10/1999 | Conrad et al. |

(Continued)

FOREIGN PATENT DOCUMENTS

EP    0 727 715    8/1996

(Continued)

OTHER PUBLICATIONS

EP Search Report for 07022412, Jun. 16, 2008,copy consists of 4 unnumbered pages.

(Continued)

*Primary Examiner*—Lan Vinh
(74) *Attorney, Agent, or Firm*—Patterson & Sheridan, LLP

(57) ABSTRACT

The embodiments of the invention relate to a method and apparatus for measuring the etch depth in a semiconductor photomask processing system. In one embodiment, a method for etching a substrate includes etching a transparent substrate in an etch chamber coupled to a vacuum transfer chamber of a processing system, transferring the transparent substrate to a measurement cell coupled to the processing system, and measuring at least one of etch depth or critical dimension using a measurement tool in the measurement cell.

18 Claims, 5 Drawing Sheets

U.S. PATENT DOCUMENTS

| | | | |
|---|---|---|---|
| 5,980,766 | A | 11/1999 | Flamm et al. |
| 6,001,699 | A | 12/1999 | Nguyen et al. |
| 6,004,706 | A | 12/1999 | Ausschnitt et al. |
| 6,007,675 | A | 12/1999 | Toshima |
| 6,027,842 | A | 2/2000 | Ausschnitt et al. |
| 6,033,814 | A | 3/2000 | Burdorf et al. |
| 6,054,710 | A | 4/2000 | Bruggeman |
| 6,060,022 | A | 5/2000 | Pang et al. |
| 6,124,212 | A | 9/2000 | Fan et al. |
| 6,129,807 | A | 10/2000 | Grimbergen et al. |
| 6,143,081 | A | 11/2000 | Shinriki et al. |
| 6,148,239 | A | 11/2000 | Funk et al. |
| 6,161,054 | A | 12/2000 | Rosenthal et al. |
| 6,166,509 | A | 12/2000 | Wyka et al. |
| 6,175,417 | B1 | 1/2001 | Do et al. |
| 6,178,239 | B1 | 1/2001 | Kishinsky et al. |
| 6,183,594 | B1 * | 2/2001 | Nazzal ............... 156/345.25 |
| 6,225,639 | B1 | 5/2001 | Adams et al. |
| 6,245,581 | B1 | 6/2001 | Bonser et al. |
| 6,313,596 | B1 | 11/2001 | Wyka et al. |
| 6,368,975 | B1 | 4/2002 | Balasubramhanya et al. |
| 6,388,253 | B1 | 5/2002 | Su |
| 6,411,389 | B1 | 6/2002 | Rushford |
| 6,413,147 | B1 * | 7/2002 | Litvak ............................ 451/7 |
| 6,413,867 | B1 | 7/2002 | Sarfaty et al. |
| 6,424,417 | B1 | 7/2002 | Cohen et al. |
| 6,424,733 | B2 | 7/2002 | Langley |
| 6,454,417 | B1 | 9/2002 | Takamoto et al. |
| 6,455,437 | B1 | 9/2002 | Davidow et al. |
| 6,479,309 | B1 | 11/2002 | Wright |
| 6,486,492 | B1 | 11/2002 | Su |
| 6,525,829 | B1 * | 2/2003 | Powell et al. ............... 356/630 |
| 6,625,497 | B2 | 9/2003 | Fairbairn et al. |
| 6,689,519 | B2 | 2/2004 | Brown et al. |
| 6,707,544 | B1 | 3/2004 | Hunter et al. |
| 6,721,045 | B1 | 4/2004 | Hunter |
| 6,762,130 | B2 | 7/2004 | Laaksonen et al. |
| 6,811,370 | B2 | 11/2004 | Buermann |
| 6,961,626 | B1 | 11/2005 | Paik |
| 7,076,320 | B1 | 7/2006 | Phan et al. |
| 7,250,309 | B2 | 7/2007 | Mak |
| 7,601,272 | B2 | 10/2009 | Nguyen et al. |
| 2001/0037994 | A1 * | 11/2001 | Ezaki ........................... 216/62 |
| 2001/0042845 | A1 | 11/2001 | van der Muehlen et al. |
| 2002/0072003 | A1 | 6/2002 | Brill et al. |
| 2002/0147960 | A1 | 10/2002 | Jevtic et al. |
| 2002/0155629 | A1 | 10/2002 | Fairbairn et al. |
| 2002/0160628 | A1 | 10/2002 | Okoroanyanwu et al. |
| 2002/0171828 | A1 | 11/2002 | Cohen et al. |
| 2003/0000922 | A1 | 1/2003 | Subramanian et al. |
| 2003/0045098 | A1 | 3/2003 | Verhaverbeke et al. |
| 2003/0045131 | A1 * | 3/2003 | Verbeke et al. ............... 438/795 |
| 2003/0052084 | A1 * | 3/2003 | Tabery et al. .................. 216/59 |
| 2003/0092281 | A1 | 5/2003 | Ramachandramurthy et al. |
| 2003/0228532 | A1 * | 12/2003 | Mui et al. ..................... 430/30 |
| 2004/0021097 | A1 * | 2/2004 | Preece ..................... 250/559.4 |
| 2004/0021856 | A1 | 2/2004 | Nishiyama et al. |
| 2004/0200574 | A1 | 10/2004 | Davis et al. |
| 2004/0203177 | A1 | 10/2004 | Davis et al. |
| 2005/0085090 | A1 | 4/2005 | Mui et al. |
| 2005/0207875 | A1 | 9/2005 | Kim |
| 2006/0154388 | A1 | 7/2006 | Lewington et al. |

FOREIGN PATENT DOCUMENTS

| | | |
|---|---|---|
| EP | 0727715 A1 | 8/1996 |
| EP | 1 079 426 | 2/2001 |
| EP | 1079428 A2 | 2/2001 |
| EP | 1 083 424 | 3/2001 |
| EP | 1083424 | 3/2001 |
| EP | 1496543 | 1/2005 |
| EP | 1496543 A | 1/2005 |
| EP | 1496543 A1 | 1/2005 |
| JP | 61 290312 | 12/1986 |
| JP | 61290312 A | 12/1986 |
| KR | 10-2003 0059634 | 7/2003 |
| KR | 10-2006 0053265 | 5/2006 |
| KR | 10-2006 0081365 | 7/2006 |
| WO | WO-0109934 A1 | 2/2001 |
| WO | WO-0184382 A1 | 11/2001 |
| WO | WO-0209170 A2 | 1/2002 |
| WO | WO-0237186 A1 | 5/2002 |
| WO | WO-03003447 A2 | 1/2003 |
| WO | WO-2004030050 A2 | 4/2004 |

OTHER PUBLICATIONS

Extended European Search Report for EP07022412, Oct. 7, 2008, copy consists of 8 unnumbered pages.

Korean Office Action dated Feb. 24, 2009 for Application No. 10-2007-0118372. (APPM/009296 KORS 02).

Chinese Official Letter of application No. 2007101877167 (APPM/9296CN02) dated Dec. 26, 2008.

Notice of Final Rejection dated Sep. 28, 2009 for Korean Patent Application No. 10-2007-118372. (APPM/009296 KORS 02).

Yang, et al., "Line-Profile and Critical Dimension Measurements Using a Normal Incidence Optical Metrology System," Proceedings of SPIE vol. 4689, Mar. 2002. cited by other.

Kota, et al., "Advanced Process Control for Polysilicon Gate Etching Using Integrated Optical CD Metrology", Proceedings of SPIE, vol. 5044 (2003) pp. 90-96. cited by other.

Anthony J. Toprac, "AMD's Advanced Process Control of Poly-gate Critical Dimension", SPIE Conference on Process, Equipment and Materials Control in Integrated Circuit Manufacturing, Sep. 1999, Santa Clara, CA. SPIE, vol. 3882. cited by other.

Lee, M.E., "Analysis of Reflectometry and Ellipsometry Data from Patterned Structures", Characterization and Metrology for ULSI Technology: 1998 International Conference, ed. D.G. Seiler, et al., 1998, pp. 331-335. cited by other.

McIntosh, J.M., et al., "Approach to CD SEM Metrology Utilizing the Full Waveform Signal", Proceedings of the SPIE, vol. 3332, pp. 51-60, Feb. 23, 1998. cited by other.

Ausschnit, Christopher P., et al., "Seeing the Forest for the Trees: A New Approach to CD Control," Ed. Bhanwar Singh, Proceeding of the SPIE, vol. 3332, pp. 212-220, Feb. 23-25, 1998. cited by other.

Moharam, M.G., et al., "Stable Implementation of the Rigorous Coupled-Wave Analysis for Surface-Relief Gratings: Enhanced Transmittance Matrix Approach," Journal of the Optical Society of America, vol. 12, No. 5, pp. 1077-1086, May 1995. cited byother.

Chateau, Nicolas, "Algorithm for the Rigourous Coupled-Wave Analysis of Grating Diffusion," Journal of the Optical Society of America, vol. 11, No. 4, pp. 1321-1331, Apr. 1994. cited by other.

G.P. Kota, et al., "Integrated CD Metrology for Poly Si Etching", Lam Research Corporation, Plasma Etch Users Group Meeting, Jan. 17, 2002. cited by other.

Raymond, Christopher J., "Angle-Resolved Scatterometry of Semiconductor Manufacturing", Microlithography World, Winter 2000, pp. 18-23. cited by other.

Extended European Search Report dated May 3, 2006 for European Application No. 06250044.2-2222. cited by other.

Collard, et al. "Integrated phase shift measurements for advanced mask etch process control," Proceedings of the SPIE—The International Society for Optical Engineering SPIE-Int. Soc. Eng. USA, vol. 5256, 2003, pp. 76-84, XP002376855. cited by other.

EP Search Report for 07022412, Jun. 16, 2008, copy consists of 4 unnumbered pages. cited by other.

Prosecution History for U.S. Appl. No. 11/031,400. cited by other.

Prosecution History for U.S. Appl. No. 11/532,195. cited by other.

Search Report for Taiwan Invention Patent Application No. 095100110 dated Dec. 22, 2009.

Prosecution History of U.S. Appl. No. 11/031,400 as of Mar. 9, 2010.

Prosecution History of U.S. Appl. No. 11/561,995 as of Mar. 9, 2010.

* cited by examiner

CLUSTER TOOL WITH INTEGRATED METROLOGY CHAMBER FOR TRANSPARENT SUBSTRATES

RELATED APPLICATIONS

This application is a continuation of U.S. patent application Ser. No. 11/031,400, filed Jan. 8, 2005, now abandoned entitled INTEGRATED METROLOGY CHAMBER FOR TRANSPARENT SUBSTRATES by Lewington et al., which is incorporated by reference in its entirety.

BACKGROUND OF THE INVENTION

1. Field of the Invention

The present invention relates to the fabrication of photomasks useful in the manufacture of integrated circuits.

2. Background of the Related Art

Photolithography techniques use light patterns and photoresist materials deposited on a substrate surface to develop precise patterns on the substrate surface prior to the etching process. In conventional photolithographic processes, a photoresist is applied on the layer to be etched, and the features to be etched in the layer, such as contacts, vias, or interconnects, are defined by exposing the photoresist to a pattern of light through a photolithographic photomask which corresponds to the desired configuration of features. A light source emitting ultraviolet (UV) light, for example, may be used to expose the photoresist to alter the composition of the photoresist. Generally, the exposed photoresist material is removed by a chemical process to expose the underlying substrate material. The exposed underlying substrate material is then etched to form the features in the substrate surface while the retained photoresist material remains as a protective coating for the unexposed underlying substrate material. Since photomasks are used repeatedly to create device patterns, quality control of photomask manufacturing is very important.

Photolithographic photomasks, or reticles, include binary (or conventional) photomasks and phase shift masks (PSM), which could be used in sub 0.13μm technology. Binary (or conventional) masks typically include a substrate made of an optically transparent silicon based material, such as quartz (i.e., silicon dioxide, $SiO_2$), having an opaque light-shielding layer of metal, such as chromium, on the surface of the substrate. Phase shift masks improve the resolution of the aerial image by phase shifting. The principle of phase shift mask is described in P. 230-234 of Plummer, Deal and Griffin, "Silicon VLSI Technology Fundamentals, Practice and Modeling", 2000 by Prentice Hall, Inc. Phase shift masks could be either attenuated phase shift or alternate phase shift mask. An attenuated phase shift mask typically includes a substrate made of an optically transparent silicon based material, such as quartz, having a translucent layer of material, such as molybdenum silicide (MoSi) or molybdenum silicon oxynitride (MoSiON), on top. When the photolithographic light, e.g. at 248 nm wavelength, shines through the patterned mask surface covered by the translucent layer, the transmission (e.g. 6% at 248 nm wavelength) and the thickness of the translucent layer create a phase shift, e.g., 180°, compared to the photolithographic light that shines through the patterned mask surface not covered by the translucent layer. An alternate phase shift mask typically includes a substrate made of an optically transparent silicon based material, such as quartz, which is etched to a certain depth to create a phase shift with the un-etched transparent substrate when the photolithographic light shines through the patterned mask. It also has a chrome layer with the same pattern as the quartz. There is another type of phase shift mask, the Chromeless Phase Lithography (CPL) Mask, which has the chrome layer removed.

Photomasks allow light to pass therethrough in a precise pattern onto the substrate surface. The metal layer on the photomask substrate is patterned to correspond to the features to be transferred to the substrate. The patterns on the photomask could be 1×, 2× or 4× the size of patterns that will be patterned on the wafer substrate. Typically, a photolithographic stepper reduces the image of the photomask by 4× and prints the pattern on the photoresist covering the wafer surface. Conventional photomasks are fabricated by first depositing one to two thin layers of metal, which could either be opaque or translucent depending on the types of masks being formed, on a substrate comprising an optically transparent silicon based material, such as quartz, and depositing a photoresist layer on substrate. The photomask is then patterned using conventional laser or electron beam patterning equipment to define the critical dimensions in the photoresist. The top metal layer, typically opaque, is then etched to remove the metal material not protected by the patterned photoresist, thereby exposing the underlying silicon based material. For a binary mask, the photomask is formed after the metal etching step. While for attenuate and alternate phase shift masks, additional photoresist patterning and etching of transparent substrate or translucent metal layer are needed to form the photomask.

Since photomasks are used repeatedly to create device patterns, the accuracy and tight distribution of the critical dimensions, and the phase shift angle and its uniformity across the substrate are key requirements for binary and phase shift photomasks. For alternate phase shift mask, the phase angle is affected by the depth of the transparent material, such as quartz. Since precise control of the phase shift is very important, the etching of the transparent material, such as quartz, is often accomplished after multiple etching processes and multiple etch depth measurements to ensure phase shift of the mask is within control limit. If the etch depth measurement is performed in a system not integrated with the etching system, process cycle time could be very long and the approach could increase the total defect counts.

Therefore, there remains a need in the art for an integrated metrology tool to measure etch depth (or phase shift angle) of photomask in a semiconductor photomask processing system.

SUMMARY OF THE INVENTION

Embodiments of the invention generally relate to a method and apparatus for measuring the etch depth in a semiconductor photomask processing system. In one embodiment, a method for etching a substrate includes etching a transparent substrate in an etch chamber coupled to a vacuum transfer chamber of a processing system, transferring the transparent substrate to a measurement cell coupled to the processing system, and measuring at least one of etch depth or critical dimension using a measurement tool in the measurement cell.

In another embodiment, a method for etching a substrate includes providing a processing system comprising a vacuum transfer chamber, an etch chamber coupled to the transfer chamber, a measurement cell coupled the transfer chamber, a robot disposed in the transfer chamber and configured to transfer substrates between the etch chamber and the measuring tool, and an optical etch depth measurement tool coupled to a bottom of the measurement cell, etching feature in a quartz layer through a patterned opaque metal layer in the etch chamber, and measuring a depth of the featured etched in the quartz layer using the measurement tool in the measurement cell.

In yet another embodiment, an apparatus for measuring the etch depth of a substrate in an etch processing system is provided that includes a vacuum transfer chamber, an etch chamber configured for etching quartz coupled to the transfer chamber, a measurement cell coupled the transfer chamber, a robot disposed in the transfer chamber and configured to transfer substrates between the etch chamber and the measuring tool, the robot having a blade configured to support a rectangular substrate, and an optical etch depth measurement tool coupled to a bottom of the measurement cell, wherein an opening at the bottom of the measurement cell that allows light beams to pass between the etch depth measurement tool and the substrate through an aperture formed through the robot blade.

Other embodiments of the invention relates to a method and apparatus for measuring the etch depth between etching for an alternate phase shift photomask in a semiconductor photomask processing system. In one embodiment, an apparatus for measuring the etch depth of a substrate in an etch processing system comprises a measurement cell coupled to a mainframe of the etch processing system, and an etch depth measurement tool coupled to the bottom of the measurement cell, wherein an opening at the bottom of the measurement cell allows light beams to pass between the etch depth measurement tool and the substrate.

In another embodiment, an apparatus for measuring the etch depth of a substrate in an etch processing system comprises a measurement cell coupled to a mainframe of the etch processing system, an etch depth measurement tool coupled to the bottom of the measurement cell, wherein an opening at the bottom of the measurement cell allows light beams to pass between the etch depth measurement tool and the substrate, and a substrate transfer robot placed in the mainframe to transfer substrate to the measurement cell, wherein the substrate transfer robot having a robot blade to hold a substrate and the robot blade having an opening to allow light beam to be shined on the substrate backside.

In another embodiment, a method of preparing an alternate phase shift mask comprises a) placing a substrate in an etch processing chamber, wherein the substrate is made of an optically transparent material and has a first patterned opaque layer and a second patterned photoresist layer on the optically transparent material, b) etching the quartz to a first etch depth, c) transferring the substrate to a measurement cell coupled to a substrate transfer chamber, d) measuring the etch depth from the substrate backside by a etch depth measurement tool coupled to the bottom of the measurement cell to determine the etch time of next etch, e) placing the substrate back to the etch processing chamber, f) etching for the etch time determined by the etch depth measurement, g) transferring the substrate to the measurement cell, h) measuring the etch depth from the substrate backside by a etch depth measurement tool coupled to the bottom of the measurement cell to determine the etch time of next etch, and i) repeating "e" to "h" until a targeted etch depth has been reached.

In another embodiment, an apparatus for measuring the etch depth of a substrate in an etch processing system comprises a measurement cell coupled to a mainframe of the etch processing system, n etch depth measurement tool coupled to the bottom of the measurement cell, wherein an opening at the bottom of the measurement cell that allows light beams to pass between the etch depth measurement tool and the substrate, a CD measurement tool coupled to the top of the measurement cell, wherein an opening at the top of the measurement cell allows light beams to pass between the CD measurement tool and the substrate, and a substrate transfer robot placed in the mainframe to transfer the substrate to the measurement cell, wherein the substrate transfer robot having a robot blade to hold the substrate and the robot blade having an opening to allow light beam to be shined on the substrate.

BRIEF DESCRIPTION OF THE DRAWINGS

So that the manner in which the above recited aspects of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION

For convenience, the present invention is described herein primarily with reference to the etching of alternate phase shift masks. The concept of the invention can be used for etching other types of photomasks.

Figure 1A:
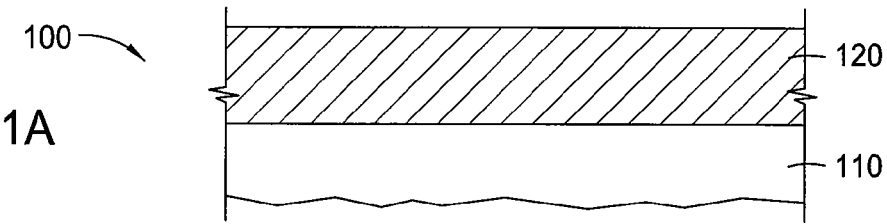
FIGS. 1A-1F are cross-sectional views showing an etching sequence for processing an alternate phase shift photomask.

FIGS. 1A-1F illustrate an exemplary process flow of creating an alternate phase shift mask. A substrate 100 is introduced into a processing chamber. The substrate 100 (or reticle) comprises a base material of an optically transparent material 110, for example, optical quality quartz, calcium fluoride, alumina, sapphire, or combinations thereof, typically made of optical quality quartz material. An opaque (or light-shielding) metal layer 120, such as chromium, is deposited on the optically transparent material 110 as shown in FIG. 1A. The light-shielding metal layer, such as chromium layer, may be deposited by conventional methods known in the art, such as by physical vapor deposition (PVD) or chemical vapor deposition (CVD) techniques. The light-shielding (or opaque) metal layer 120 is typically deposited to a thickness between about 50 and about 150 nanometers (nm) thick, however, the depth of the layer may change based upon the requirements of the manufacturer and the composition of the materials of the substrate or metal layer.

Figure 1B:
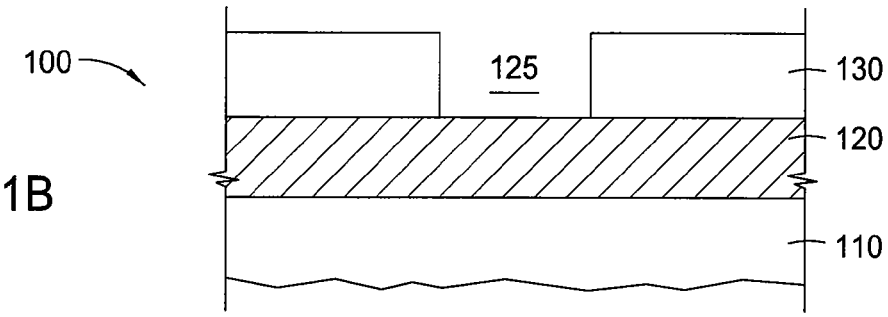

Referring to FIG. 1B, the substrate 100 is then transferred to another processing chamber where a layer of resist material 130, such as "RISTON" resist, manufactured by Du Pont de Nemours Chemical Company, is deposited upon the opaque metal layer 120 to a thickness between about 200 and 600 nm thick. The resist material 130 is then pattern etched using conventional laser or electron beam patterning equipment to form a first opening 125 which is used to define the dimensions of the second opening 135 to be formed in the opaque metal layer 120.

The substrate 100 is then transferred to an etch system, such as the Tetra II™ photomask etch chamber in the Tetra II™ photomask etch system described in FIG. 3 (described below), manufactured by Applied Materials, Inc., of Santa Clara, Calif. Aspects of the invention will be described below in reference to an inductively coupled plasma etch chamber that includes the Tetra II™ photomask etch chamber. However, other process chambers may be used to perform the processes of the invention, including, for example, capacitively coupled parallel plate chambers and magnetically enhanced ion etch chambers as well as inductively coupled plasma etch chambers of different designs.

Figure 1C:
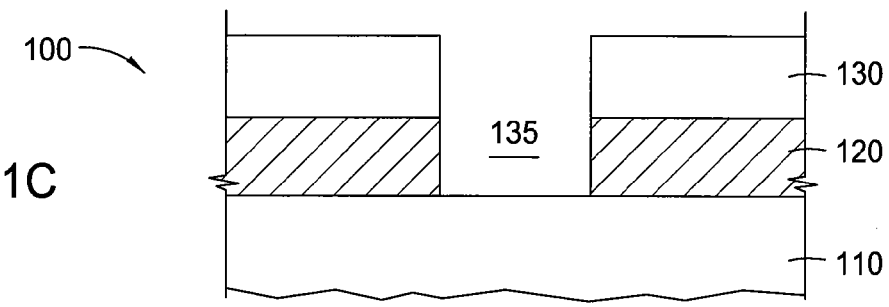

The light-shielding metal layer 120 is etched using metal etching techniques known in the art or by new metal etching techniques that may be developed to form the second opening 135 which expose the underlying transparent material 110 as shown in FIG. 1C.

Referring to FIGS. 1A-1C, after etching of the light-shielding metal layer 120 is completed, the substrate 100 is transferred to a processing chamber, where the remaining resist material 130 is usually removed from the substrate 100. The resist removal could be accomplished by an oxygen plasma process, or other resist removal technique known in the art.

Figure 1D:
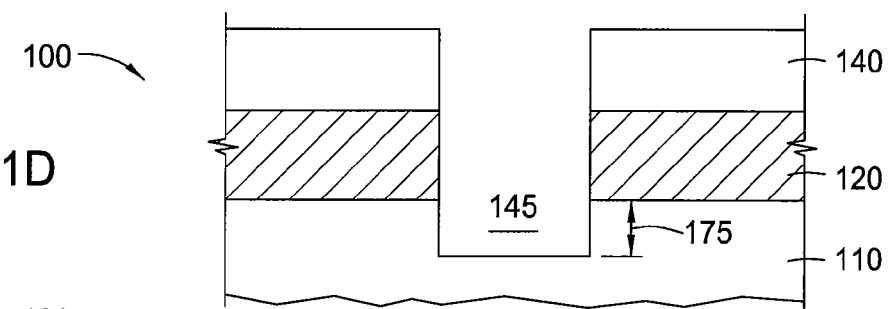
Figure 1E:
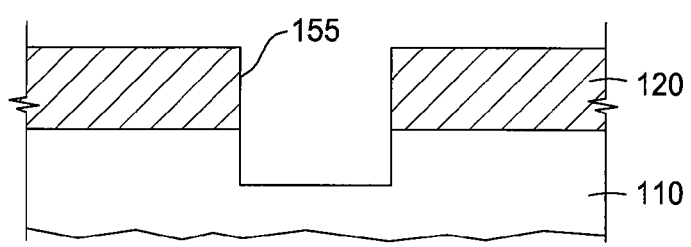
Figure 1F:
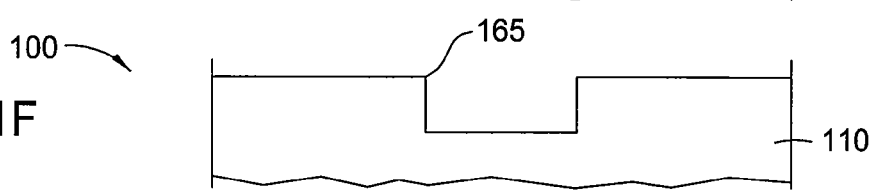

Referring to FIGS. 1D-1F, the substrate 100 may be further processed by etching the transparent material 110. In etching the transparent material 110, the resist material 130 is removed and a second photoresist 140 is applied and patterned to expose the underlying transparent material 110 within the second opening 135. The resist material is deposited to a depth between about 200 nm and 600 nm thick, but may be of any thickness and may also be of the same thickness as the depth of the features to be etched in the transparent material 110 to form the photomask. The photoresist 140 is then etched to form a third opening 145 in the resist layer 140 and the metal layer 120. The patterned substrate 100 is then transferred to an etch chamber, such as the Tetra II™ photomask etch system described in FIG. 3 (described below), for plasma etching the transparent material 310.

Since the etch depth 175 in the transparent material 110 determines the phase shift angle, the precise control of the etch depth 175 is very critical. For example, In order to achieve a phase shift angle of 180° for alternate phase shift mask for KrF excimer laser lithography, the quartz etch depth is about 2400 Å. To avoid over-etch, the initial etching only etches partially, such as 50%-75%, of the targeted etch depth. The etch depth 175 (or phase shift angle) of the etched substrate 100 is measured at an integrated metrology tool. The substrate 100 subsequently undergoes additional etch and etch depth measurement until the targeted etch depth 175 is reached. Performing etch depth measurement in an integrated metrology tool has the advantage of avoiding the need of transferring the substrate to an area not under the same vacuum environment. Transferring substrates to an area not under the same vacuum environment repeatedly is time consuming, due to breaking vacuum, and could result in particle generation, which is very undesirable for photomask making.

After the targeted etch depth 175 is reached, the second resist material 140 is then removed to form a patterned substrate surface 155. An alternate phase shift mask with a patterned substrate surface 165 is formed after the metal layer 120 is removed. Occasionally, dry etching in an etch chamber only etches to reach a percentage of the final etch depth and the final step is a wet etch step, since wet etch could reduce the surface roughness and could reduce the micro-trenching on the photomask substrate.

Alternate phase shift photomask etching processes for light-shielding layers such as chromium, and optically transparent materials, such as quartz, include dry etching processes. Plasmas of etching gases, such as chlorine-containing gases (e.g. $Cl_2$) or fluorine-containing gases (e.g. $SF_6$ or $CF_4$), oxidizing gases, such as oxygen, and inert gases, such as helium, could be used to etch the metal layers formed on the substrate or the substrate itself. Details of etching chemistries that are used to etch light-shielding layer for this application have been disclosed in commonly assigned U.S. patent application Ser. No. 10/418,795, titled "Process For Etching Photomasks", and filed on Apr. 18, 2003 and U.S. patent application Ser. No. 10/235,223, titled "Methods And Apparatus For Etching Metal Layers on Substrates", and filed on Sep. 4th, 2002. Etching of the silicon based material of the substrate is described in commonly assigned U.S. Pat. No. 6,534,417, titled "Method and Apparatus For Etching Photomasks", issued Mar. 18, 2003 and U.S. Pat. No. 6,391,790, also titled "Method and Apparatus For Etching Photomasks", issued May 21, 2002. The disclosures of all of these applications are incorporated herein by reference to the extent not inconsistent with aspects of the invention.

Etch depth metrology techniques as employed by the present invention are advanced process control (APC) enablers. It detects the reflection of a substrate over a broad wavelength range. The detected wavelength spectra are fitted to a theoretical model to enable the characterization of the film. The metrology can be used to measure transparency, etch depth, film thickness and phase shift angle at multiple locations on the substrate. An example of the etch depth (or phase shift angle) measuring tool is the n&k Analyzer 1512RT available from n&k Technology, Inc. of Santa Clara, Calif.

Figure 2:
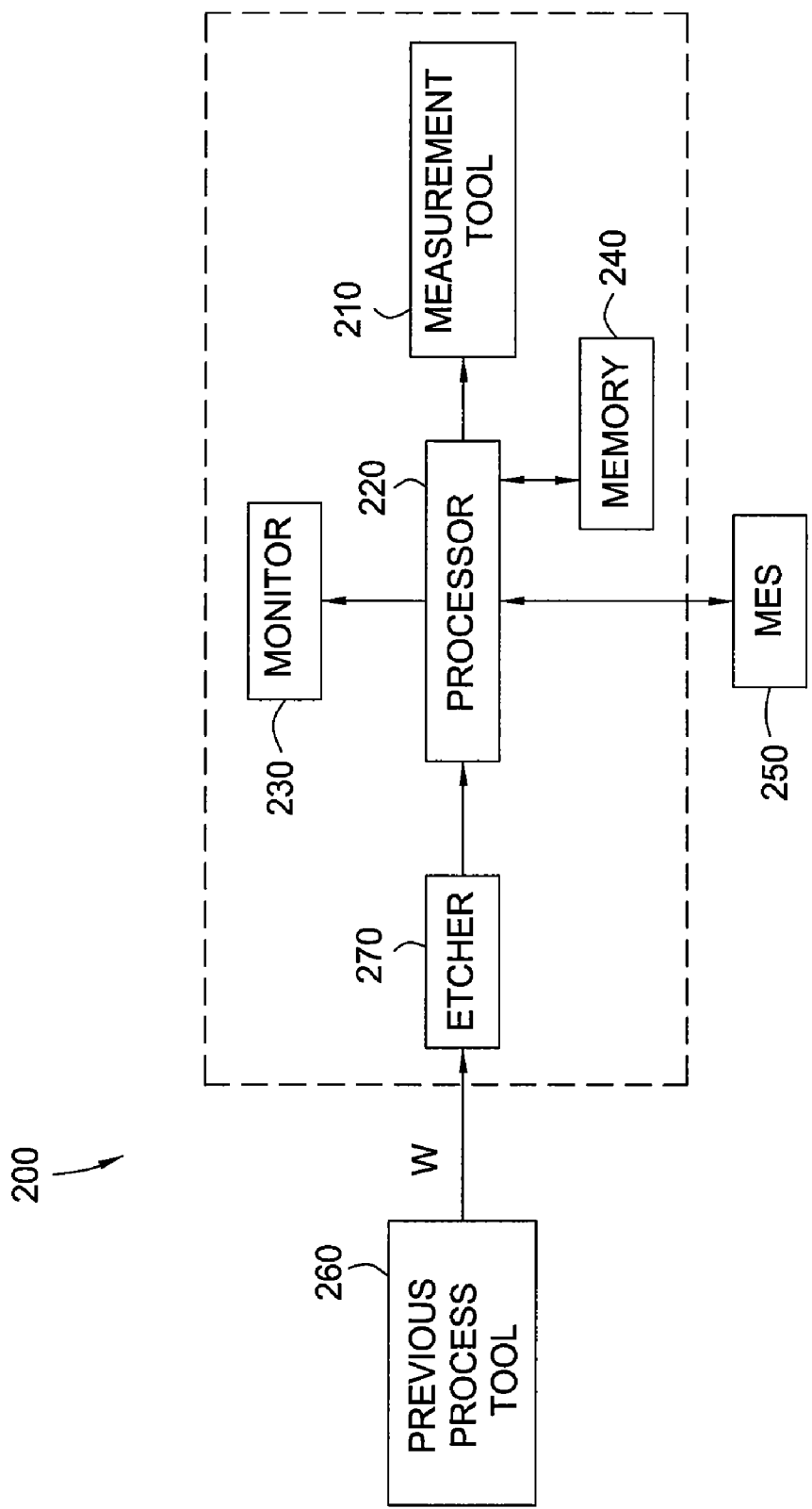
FIG. 2 is a block diagram of key components of an integrated etch system.

An exemplary embodiment of the present invention is implemented using a etch depth measuring tool in a processing system 200, as shown in FIG. 2, comprising a measuring tool 210, e.g., a etch depth (or phase shift angle) measurement tool. Processing system 200 further comprises a processor 220, which performs the analysis disclosed herein electronically, and a monitor 230 for displaying results of the analyses of processor 220. Processor 220 can be in communication with a memory device 240, such as a semiconductor memory, and a computer software-implemented database system 250 known as a "manufacturing execution system" (MES) conventionally used for storage of process information. Processor 220 can also be in communication with the measuring tool 210, and etcher 270.

Figure 3:
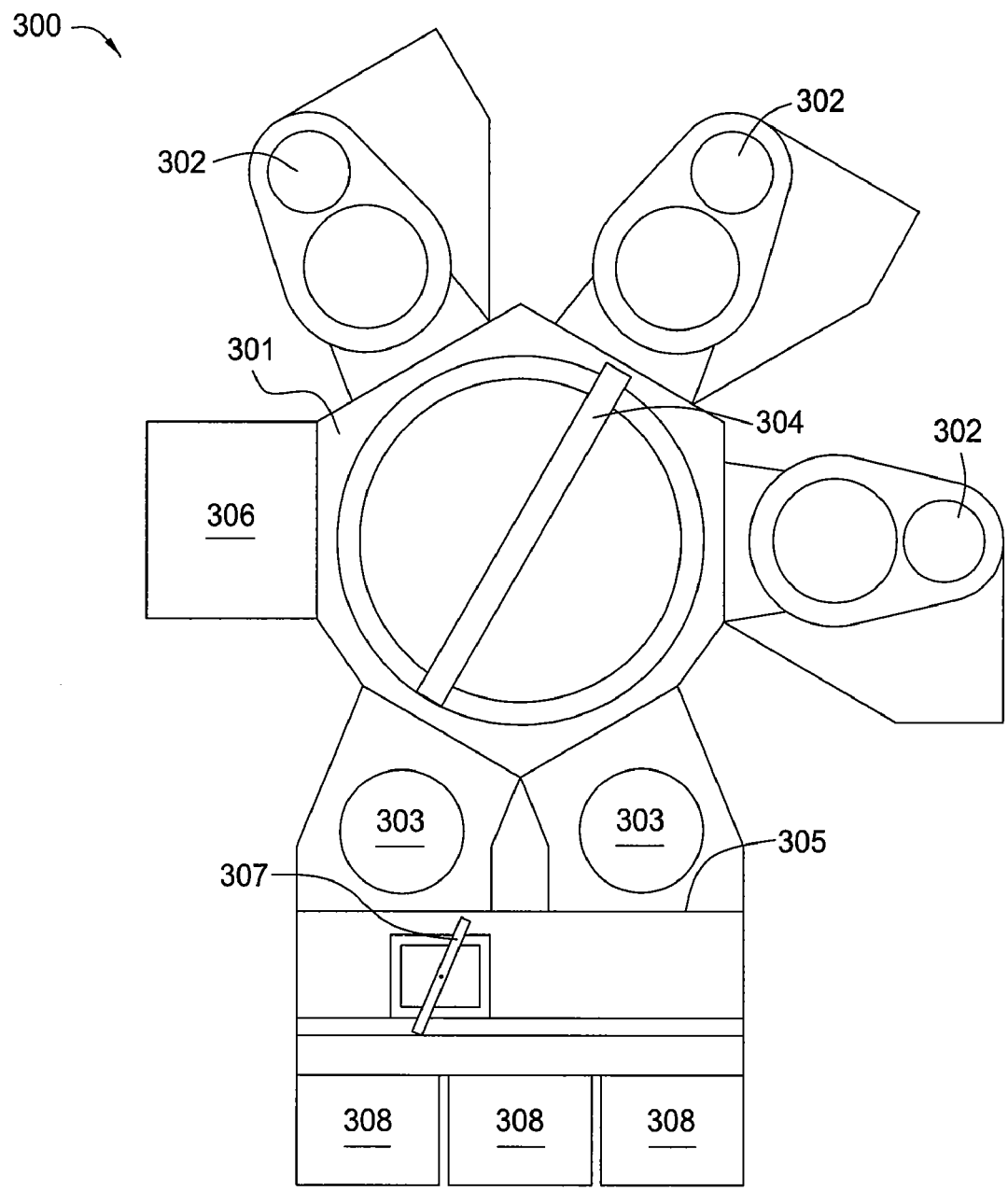
FIG. 3 is a diagram of one embodiment of an integrated etch system.

An example of an etch system that is integrated with an ex-situ metrology tool with the capability of measuring etch depth (or phase shift angle) is shown in FIG. 3. The system, Tetra II™, comprises a chamber or "mainframe" 301, such as the Centura™ processing system available from Applied Materials, Inc. of Santa Clara, Calif., for mounting a plurality of processing chambers, e.g., Tetra II™ photomask reactors (or chambers) 302, and one or more transfer chambers 303, also called "load locks". In one embodiment of the present invention, three etch reactors 302 and one metrology tool 306 are mounted to the mainframe 301. The metrology tool 306 can be placed under the same vacuum as the mainframe 301, since there is an opening (not shown) between the mainframe 301 and the metrology tool 306 to make them in fluid communication. In one exemplary embodiment, three etchers 302 are used for etching. A robot 304 is provided within the mainframe 301 for transferring wafers between the processing reactors 302, the transfer chambers 303, and an integrated metrology tool 306. The integrated metrology tool 306 can measure the etch depth (or phase shift angle). The transfer chambers 303 are connected to a factory interface 305, also known as a "mini environment", which maintains a controlled environment. In one embodiment of the invention, the metrology (or measurement) tool 306, mounted to the mainframe 301, has high-speed data collection and analysis capabilities. Cassette holders 308 are connected to the other end of the factory interface 305. A robot 307 is placed inside 305 to transfer substrate between cassette holders (308), and "load locks"(303).

The etch depth measurement tool 306 is mounted to the mainframe 301 to allow the etched substrate from the etch chamber 302 to be measured and be sent back to etch chamber 302 to be etched again. The etch and measurement process sequence could repeat several times until the targeted etch depth (or phase shift angle) is reached. Due to the nature of repeated etch and measurement to target etch depth of transparent material 110, it is desirable to have the etch depth measurement tool (or phase shift angle measurement tool) mounted to the mainframe 301. Both mainframe 301 and the metrology tool 306 are under integrated vacuum environment and can avoid the need of transferring the substrate to an area not under vacuum, which could be time consuming due to additional substrate transport and breaking the vacuum. Repeated transferring substrate between processing areas that are under vacuum and not under vacuum is not only time consuming, but also particle generating.

In another embodiment of the invention, the metrology tool 306 is placed at the location of one of the transfer chambers 303. Placing the metrology tool 306 at the location of one of the transfer chambers 303 also has the advantage of avoiding the need of transferring the substrate to an area not under vacuum.

Since the substrate is transparent, the phase shift angle (or etch depth) can be measured by analyzing reflected light from the backside of the substrate, which does not require the removal the opaque film 320 and the photoresist film 340. Conventional phase shift angle measurement is performed from the substrate front side and requires the removal of the opaque film 320 and the photoresist film 340 prior to phase shift angle measurement. The additional processing steps of removing films can cause particles or other processing defects, which are highly undesirable for photomask preparation. Besides, if the phase shift angle (or etch depth) is found to have not reached the target, the opaque film 320 and photoresist film 340 would need to be re-deposited and re-patterned again to allow further etching of the transparent material 310, which could worsen the particles and other processing defects problems.

Figure 4:
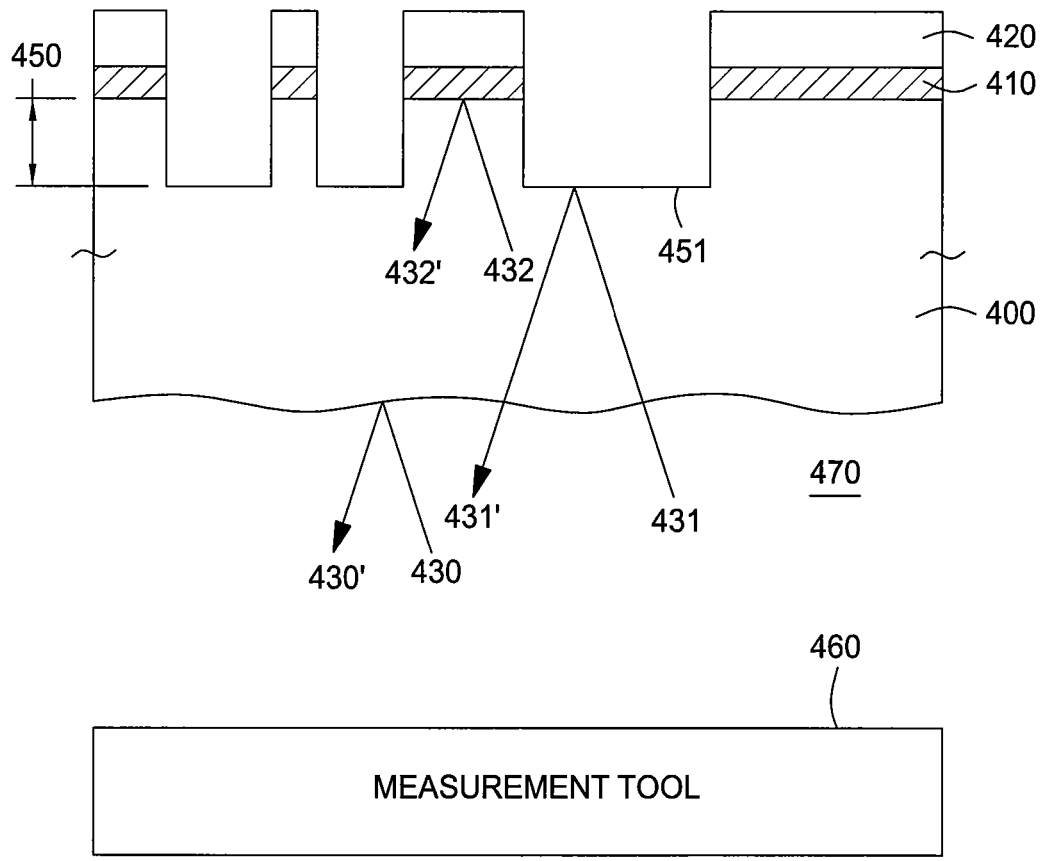
FIG. 4 is a schematic diagram showing a substrate, a measurement tool, and the impeding and reflected light beams between the substrate and the measurement tool.

FIG. 4 shows a schematic drawing of an etch depth measurement tool (or phase shift angle measurement tool) 460, placed below the backside of a substrate 400. The substrate 400 has an etch depth 450 and also has an opaque film 410 and a photoresist film 420 on the front side. On the back side of the substrate 400, there are incident light beams 430 and 432, and reflected light beams 430', 431' and 432'. The light source of incident light beams could be from the measurement tool 460. The light source is preferably a broadband light source. Part of incident light beam 430, reflected light beam 430', is reflected from the interface between the substrate 400 and the environment 470. Reflected light beam 431' is reflected from the interface between the substrate etch interface 451 with the environment 470. Reflected light beam 432' is reflected from the interface between the opaque layer 410 and the substrate 400. The etch depth measurement tool 460 collects reflected light beams over a range of substrate backside surface. By calculating the phase shift between the light beams such as 431' and 432', the etch depth 450 and the phase shift of the transparent substrate can be determined without removing the films on the front side, such as opaque film 410 and photoresist film 420, of the substrate 400.

Figure 5A:
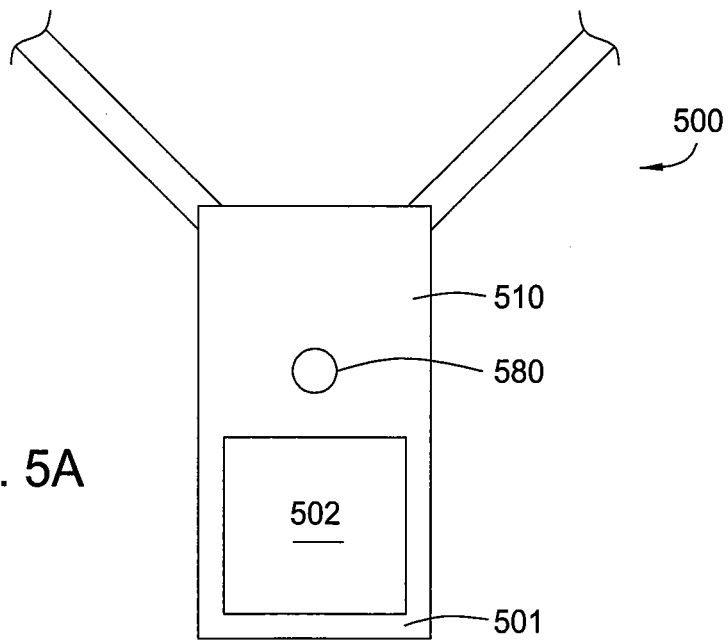
FIG. 5A shows a schematic drawing of the end of the robot arm with a robot blade.

In one embodiment of the invention a robot arm 500, which is part of robot 304 of the mainframe 301 of FIG. 3, is designed to include a substrate holder 501. The substrate holder 501 has an opening that allows the incident light beams and reflected light beams on the substrate backside to pass through, as shown in FIG. 5A. FIG. 5A shows a schematic drawing of the end of the robot arm 500 that contains a robot blade 510, which has a substrate holder 501. The substrate holder 501 has an aperture 502 that is proportional to the size of the substrate. In one embodiment, the aperture 502 is about 4 inches by 4 inches for a 6 inches by 6 inches substrate. The size of the aperture 502 is smaller than the size of the substrate to allow the edge of the substrate to be supported by the substrate holder. In one embodiment, the thickness of the robot blade 510 is about ⅖ inch (1.02 cm). The size of the aperture 502 should be as large as possible to allow measurement data to be collected across large area on the substrate.

Figure 5B:
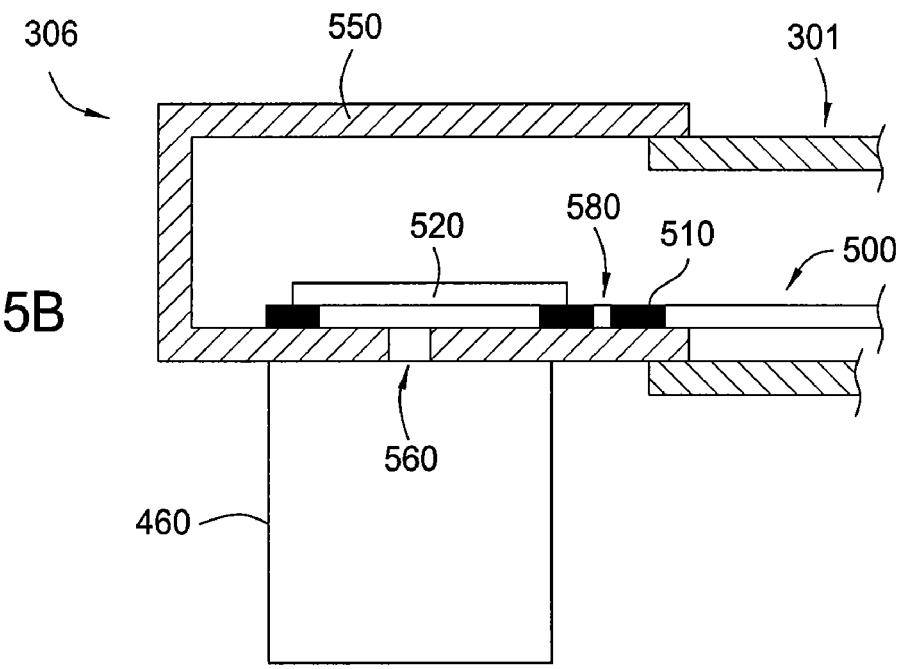
FIG. 5B shows a schematic drawing of a measurement cell and an etch depth metrology tool.

FIG. 5B shows the substrate 520 is placed inside the metrology tool 306 of FIG. 3. The metrology tool 306 comprises a measurement cell 550 and an etch depth measurement tool 460. The substrate is moved by the robot arm 500 to be over the measurement point. Underneath the measurement point 560 is a etch depth measurement tool 460. The etch depth measurement tool 460 comprises a broadband light source (not shown), which emits light to the backside of the substrate 520. The robot blade 510 is attached to the robot arm 500 and it has roll and tilt function to allow the surface of substrate 520 to be perpendicular to the measurement light beam emitted from the measurement tool 460. The etch depth measurement tool 460 collects the reflected light from the substrate backside. The data generated from the reflected light are analyzed to calculate the etch depth by the measurement tool 460. In one embodiment of the invention, there is a calibration pad 580, which contains an etch depth measurement calibration device, such as a piece of bare silicon, on the robot blade 510. In one embodiment, the size of the calibration pad is about ½ inch (1.27 cm) in diameter. Periodically, the calibration pad 580 can be moved to be above the measurement point 560 to calibrate the measurement tool 460. A native oxide layer is typically present on the bare silicon surface. The presence of the native oxide layer is important for calibration of some measurement tools. In one embodiment, the measurement point 560 is a circular opening with a diameter, such as about 1 inch (2.54 cm).

The advantage of backside etch depth measurement is that the measurement does not require the removal of the front side films. Therefore the substrate can be partially etched first, then be measured to target the next etch amount. The substrate can then be re-etched and re-measured multiple times without the need of moving the substrate to another system to perform photoresist layer stripping. For alternate phase shift mask making, the precise control of the phase shift angle (or etch depth) is very critical. Since the substrate is transparent and the phase shift angle can be measured from the backside, the processing time can be greatly reduced, since the fine tuning of the substrate etch does not require removal of the substrate from the etching module.

Figure 5C:
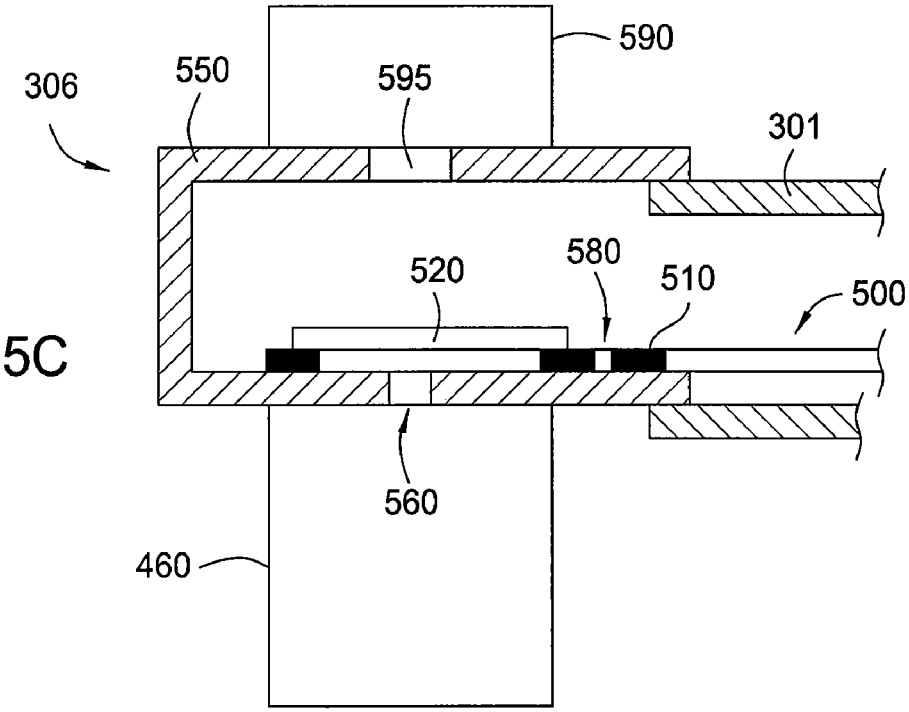
FIG. 5C shows a schematic drawing of a measurement cell with an etch depth measurement tool and a CD measurement tool.

In addition to the mounted etch depth measurement tool 460 on the bottom of the measurement cell 306, in one embodiment of the invention, a CD measurement tool 590 is mounted on top of the measurement cell 306 to collect critical dimension (CD) measurement data through an opening 595 (as shown in FIG. 5C). The collected CD measurement data can be fed forward and backward to the etcher to adjust the substrate etch recipe. Since CD measurement has more stringent measurement location requirement than etch depth measurement, the robot arm 500, which is part of robot 304 in the mainframe 301, might not have sufficient precision control as required. The CD measurement tool 590 could include a moving device (not shown), to allow a measuring device (not shown) in the CD measurement tool to be moved over to a particular measurement location above the substrate 520. The movement of the moving device is controlled by a controller to control its precise movement. FIG. 5C shows a schematic drawing of metrology cell 306 with a top CD measurement tool 590 and a bottom etch depth measurement tool 460.

The CD measurement tool 590 can employ OCD (optical critical dimension) metrology techniques. OCD metrology techniques are advanced process control (APC) enablers. For example, normal incidence spectroscopic OCD metrology systems provide detailed line profiles not possible with in-line non-destructive SEMs. For photomasks, the OCD metrology can operate under reflective mode (utilizing reflected light) or transmission mode (utilizing transmitted light). The compact size and speed of OCD technology enables the measurement system of the present invention to be fully integrated into a process tool, such as Applied Materials' Tetra II™ or Dps®II etch system. When combined with APC software, this provides a complete, feed-forward solution for wafer-to-wafer closed loop control. An example of the optical CD measuring tool is the Nano OCD 9000 available from Nanometrics of Milpitas, Calif., or an optical imager as disclosed in U.S. Pat. No. 5,963,329. The optical CD measuring tool can utilize scatterometry, reflectometry or transmission ellipsometry techniques.

While the foregoing is directed to the preferred aspects of the invention, other and further aspects of the invention may be devised without departing from the basic scope thereof, and the scope thereof is determined by the claims that follow.

The invention claimed is:

1. A method for etching a substrate, comprising:
    etching a transparent substrate in an etch chamber coupled to a mainframe;
    transferring the transparent substrate to a measurement cell coupled to the mainframe;
    measuring etch depth in the measurement cell using a measurement tool coupled to the measurement cell, wherein the etch depth is measured by using a light beam passed through a robot blade to a backside of the substrate;
    supporting the transparent substrate in the measurement cell on the robot blade while measuring;
    determining if the measured etch depth meets a target depth;
    transferring the transparent substrate to the etch chamber and further etching the transparent substrate if the measured etch depth does not meet the target depth; and
    maintaining the transparent substrate under a vacuum environment during the etching, transferring and measuring.

2. The method of claim 1, further comprising:
    measuring critical dimension using a light beam passed through the measurement cell to a top of the substrate.

3. The method of claim 1, wherein measuring etch depth further comprises:
    illuminating the transparent substrate with a beam generated from a broadband light source.

4. The method of claim 1, wherein transferring the transparent substrate to the measurement cell coupled to the mainframe comprises:
    transferring the transparent substrate to the measurement cell coupled to the mainframe using a robot disposed in the mainframe.

5. The method of claim 1, further comprising:
    adjusting roll and tilt of a robot blade relative to a light beam emitted from the measurement tool.

6. The method of claim 1, wherein measuring etch depth further comprises:
    collecting light from a backside of the transparent substrate using the measurement tool.

7. The method of claim 1, wherein measuring etch depth further comprises:
    (a) measuring a depth etched into a quartz layer through a patterned opaque metal layer.

8. The method of claim 7 further comprising:
    repeating the measuring, determining, and transferring and further etching steps until the measured etch depth reaches the target depth.

9. The method of claim 1 further comprising:
    calibrating the measurement tool using a calibration pad disposed on a robot blade.

10. The method of claim 9, wherein the calibration pad comprises a bare silicon surface.

11. The method of claim 9, wherein the calibration pad comprises a native oxide layer disposed on a silicon member.

12. A method for etching a substrate, comprising:
    providing a processing system comprising a vacuum transfer chamber, a mainframe coupled to the vacuum transfer chamber, an etch chamber coupled to the mainframe, a measurement cell coupled to the mainframe, a robot disposed in the mainframe and configured to transfer a substrate between the etch chamber and the measurement cell, and an optical etch depth measurement tool coupled to a bottom of the measurement cell;
    etching a feature in a quartz layer through a patterned opaque metal layer on the substrate in the etch chamber;
    transferring the substrate from the etch chamber to the measurement cell on a blade of the robot
    measuring a depth of the feature etched in the quartz layer using the measurement tool in the measurement cell, the depth measured while the substrate is supported on the blade of the robot; and
    maintaining the substrate under a vacuum environment during the etching, measuring and transferring.

13. The method of claim 12 further comprising:
    measuring a critical dimension of the feature etched in the quartz layer while in the measurement cell.

14. The method of claim 12, wherein measuring the depth of the feature etched in the quartz layer further comprises:
    analyzing a light beam that extends from the quartz layer through the blade of the robot to the measurement tool.

15. The method of claim 12, further comprising:
    further etching the quartz layer if the measured depth does not meet the target depth.

16. The method of claim 12, wherein measuring the depth of the feature etched in the quartz layer further comprises:
    illuminating the substrate with a beam generated from a broadband light source.

17. The method of claim 12, wherein measuring the depth of the feature etched in the quartz layer further comprises:
    collecting light from a backside of the substrate using the measurement tool.

18. The method of claim 17, further comprising:
    measuring critical dimension using a light beam passed through the measurement cell to a top of the substrate.

* * * * *